June 15, 1971 D. C. HOWE ET AL 3,584,376

MICROSTRIP DELAY LINE AND A METHOD OF MANUFACTURING SAME

Filed Oct. 25, 1968

3,584,376

MICROSTRIP DELAY LINE AND A METHOD OF MANUFACTURING SAME

David C. Howe, Stamford, Vt., and George A. Senf, North Adams, Mass., assignors to Sprague Electric Company, North Adams, Mass.

Filed Oct. 25, 1968, Ser. No. 770,679
Int. Cl. H05k *3/06*
U.S. Cl. 29—625 4 Claims

ABSTRACT OF THE DISCLOSURE

A microstrip delay line is formed by etching a metal film to a highly-defined pattern, gold-plating the pattern and bonding the plated pattern onto a ceramic base.

BACKGROUND OF THE INVENTION

This invention relates to microstrip delay lines and in particular to low resistance lines formed by bonding a preformed metal film pattern onto a dielectric base.

The rapid advancement in the field of high speed digital integrated circuits has produced a requirement for miniaturized delay lines having the requisite high frequency characteristics. A response to this need has been the parallel plate microstrip delay line in which an active line comprising a series inductance is formed by deposition of a conductive spiral pattern on one surface of a ceramic substrate. A distributed shunt capacitance is provided by a conductive ground plane deposited on the opposing substrate surface and in proximate capacitive relation to the spiral.

The active line is usually formed by one of the two well known techniques: silk screening or "printing" by metal deposition, plating and etching. Both of these techniques have certain disadvantages. The silk screen process requires a great many carefully controlled process steps: a blueprint of the conductive pattern, generally to an enlarged scale, must first be drafted; an art work original must be formed and photographed onto photosensitive silk screen film; the latter is then developed to produce an image that is transferable to a silk screen to enable forming positive printed conductive patterns on the substrate. The pattern, after being laid down with thick film type silver screening ink, is fired in a temperature controlled kiln and, finally, the defined pattern is plated with gold, copper or other metal to bring the D.C. resistance of the pattern to the desired level. In addition to the many steps required, there is poor surface definition of the pattern, especially on a ceramic substrate, because of the tendency of the ink to run out along the sides. Also, a greater degree of tolerance control is required since the screen steps must be confined to 2 or 3 inch square areas.

The printing technique requires that a conductive metal layer is suitably disposed on an insulator and a resist pattern of the desired design is applied to the metal surface in either a positive or a negative configuration. Depending upon the type of resist used, appropriate intermediate steps are undertaken, whereupon the unwanted metal foil is etched away. Some disadvantages of this technique are that the metal layer is quite thin and subject to rupture or peeling even after being affixed to a substrate. Also, after etching, the foil edges are undercut and rendered concave by the action of the etchant. Adhesion problems are often encountered along with acid damage to the substrate.

It is therefore one object of the present invention to provide a microstrip delay line having an "active" conductive pattern on a substrate formed by means of a process utilizing a simpler procedure with a reduced number of process steps.

It is a further object to produce a more highly defined conductive pattern for such a line than heretofore realized.

It is another object to produce a microstrip delay line with improved conductivity characteristics due to the low resistance of the improved conductive pattern.

SUMMARY OF THE INVENTION

Broadly, a delay line constructed in accordance with this invention comprises a distributed series inductance formed as a conductive spiral on the surface of a ceramic substrate and a distributed series capacitance provided by depositing a conductive ground plane on the opposing substrate surface and in proximate capacitive relation to the spiral.

In a more limited sense, the conductive spiral is produced by forming the desired circuit pattern on both sides of a metal film by photolithographic and etching procedures. This pattern is then gold plated and bonded to a desired location on the substrate surface and the ground plane is subsequently deposited by a preferred deposition process.

This method requires fewer operational and handling steps than the previously mentioned methods. Since the etching is performed on both sides of the metal, the pattern is more clearly defined. Also, the etch area can be over a foot square permitting a plurality of patterns to be simultaneously etched.

BRIEF DESCRIPTION OF THE DRAWINGS

A further understanding of the invention can be achieved from a study of the following description and drawings wherein.

DESCRIPTION OF THE INVENTION

Figure 1:
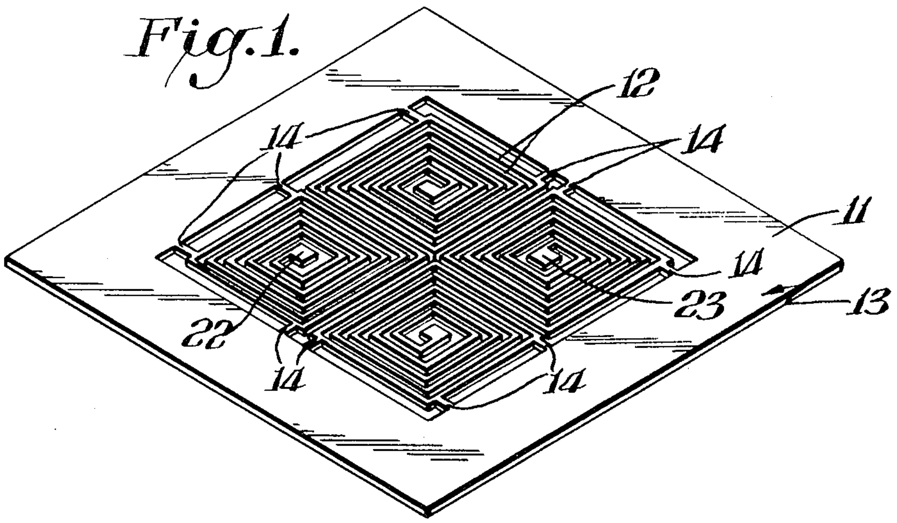
FIG. 1 shows the metal film etched into a spiral with attached frame.

The improved method of constructing a delay line comprises the steps of etching a desired spiral pattern on both sides of a conductive metal film; gold plating all surfaces of the patterned film and bonding the film onto the surface of a ceramic substrate. FIG. 1 shows a metal film 11 of copper 2 mils thick which has been etched to form a desired four-spiral pattern 12. The pattern is attached to a frame 13 at tie points 14. The pattern and frame are defined by using well known photoresist techniques to obtain a resist pattern which is applied to both sides of the film surface. The film is then suspended in an etch bath of ferric chloride or ferric nitrate. The film is thick enough to provide a rigid self-support in the etchant. Since the etchant attacks both sides simultaneously, the pattern is sharply defined with reduced undercutting.

After removal from the etchant, the photoresist is removed and all surfaces of the film are plated with a layer of approximately 100 $\mu$-in. of gold. Alternatively, a flash of nickel (10–50$\mu$) may be put on the copper before the gold-plating process to decrease the dissolution of gold in the copper.

Figure 2:
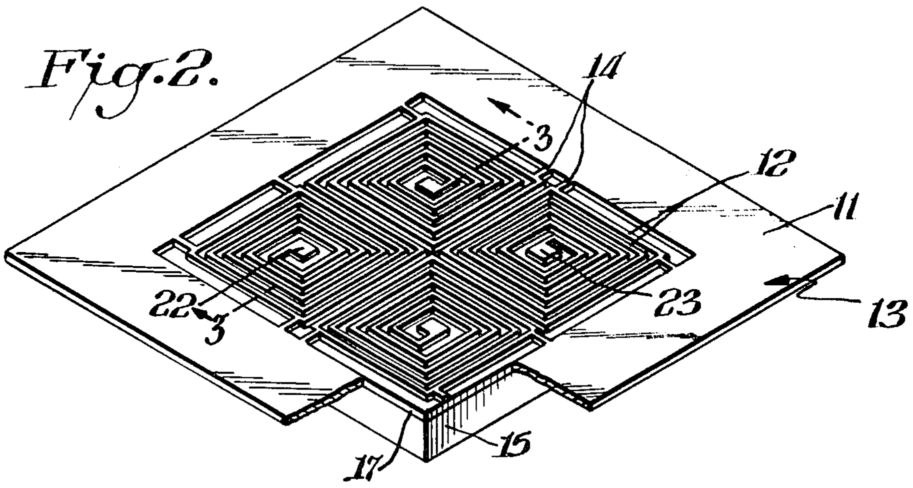
FIG. 2 shows the gold-plated film in place on a ceramic substrate.
Figure 3:
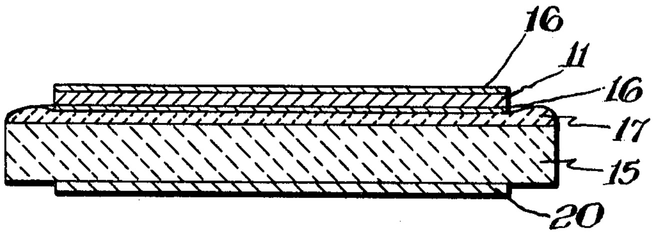
FIG. 3 shows a representative sectional view through line 3—3 of FIG. 2.

The plated film, still attached to the frame, can now be positioned onto ceramic substrate 15 as shown in FIGS. 2 and 3. The film, plated with gold layers 16, rests on the substrate surface which is covered with a 1 mil thick, air-dried, uniform coat 17 of glass glaze having a dielectric constant between 6 and 10. FIG. 3 shows a representative sectional view of the film as it rests on the surface of the substrate. In order to provide reasonably exact positioning on the substrate, a specially designed jig with dowel pins (not shown) can be used to position the substrate and frame by aligning with holes which can be etched through frame 12 during the etching process. When the frame is fitted over the opening, the pattern is placed in its desired location on the substrate. The frame can be masked, but this is not necessary for this invention. The plated pattern is fired at a temperature of approximately 1300° F. The wetting properties of the glaze to the gold and the ceramic cause the formation of a strong adhesive bond of pattern 12 to substrate 15. The gold or nickel flash-gold plating, is, moreover, thick enough so that a cuprous oxide formation is not a problem during the firing process.

The mask if used can then be removed from the frame area and the pattern can be separated from the frame by cutting along tie points 14.

The delay line is completed by depositing ground plane 20 on the opposing side of substrate 15. The ground plane can be a solid layer or it can be uniformly spaced along the length and width of the active line to afford a characteristic impedance along the length of the delay line. If desired, the ground plane pattern can be formed using the same process steps as for the spiral pattern. The input pulse to the line is applied between terminal 22 (FIG. 1) and the ground plane and the output is measured between terminal 23 and the ground plane. The spiral design (number of turn, segment width) and the substrate qualities (permittivity, strength) are determined by particular design requirements.

Since the bonding agent in the present example is a dielectric material forming an electrical interface with another dielectric material, an important attribute of the bonding agent is its dielectric constant in relation to the substrate. For the example given, it was assumed that the ceramic substrate has a dielectric constant greater than 20 while the glass glaze had a dielectric constant of 6–10. This combination would produce a decrease in the delay time and an increase in characteristic impedance (compared to the substrate with no interface). An alternate bonding agent can be obtained by depositing a low temperature thick film ceramic material in a layer approximately 1 mil thick on the substrate surface. This ceramic has a dielectric constant greater than 20 producing delay increases and lower impedances (compared to the case of the substrate alone).

The ceramic substrate in the preferred embodiment is composed of equal parts of $TiO_2$ and $Ba_2Ti_9O_{20}$. The low temperature thick film ceramic is composed of barium titanate mixed with a glass frit binder.

A third bonding agent is a thick film silver electrode material which is directly applied to the plated spiral pattern. The pattern is then placed on the substrate and heated. The bond is made by the glass portion of the silver ink wetting out on the spiral and substrate. Since the silver makes electrical contact with the substrate, the effects that the other two bonding agents had on the delay line characteristics are not a factor.

Although only one delay line was described, many units can be constructed using the methods described herein.

A plurality of patterns could be simultaneously etched, plated and applied to a large ceramic substrate surface (up to one foot square). After the bonding operations, each unit could be physically separated by breaking the substrate at pre-weakened separation positions.

Since it is obvious that many changes and modifications can be made in the above-described details without departing from the nature and spirit of the invention it is to be understood that the invention is not limited to said details except as set forth in the appended claims.

What we claim is:

1. A method of forming a microstrip delay line comprising the steps of forming the active line by:

(a) applying a first photoresist pattern to one surface of a rigid self-supporting conductive film, wherein said pattern defines at least one inductive spiral attached to a frame member;

(b) applying a second photoresist pattern to the opposing surface of said conductive film and in registration with said first pattern;

(c) simultaneously etching completely through both sides of said conductive film;

(d) gold-plating all surfaces of the inductive spiral or spirals of said conductive film;

(e) applying the inductive spiral or spirals of said plated film onto a dielectric substrate having a bonding agent covering the surface thereof;

(f) applying heating means to said bonding agent whereby a bond is formed between substrate and film;

(g) severing said frame member from said inductive spiral; and (h) placing on the free surface of said substrate a desired ground pattern.

2. The method of forming a microstrip delay line described in claim 1 wherein the etched film is covered with a flash of nickel approximately 10–50$\mu$ thick prior to the gold-plating step.

3. The method of forming the microstrip delay line described in claim 1 wherein the dielectric substrate is ceramic and the bonding agent is a thick film glass glaze having a dielectric constant of at least 6–10.

4. The method of forming the microstrip delay line described in claim 3 wherein the bonding agent is a low temperature thick film ceramic material having a dielectric constant greater than 20.

References Cited

UNITED STATES PATENTS

| | | | |
|---|---|---|---|
| 3,177,103 | 4/1965 | Talley et al. | 156—11X |
| 3,197,290 | 7/1965 | Williams | 161—207X |
| 3,264,152 | 8/1966 | Haydon | 29—625X |
| 3,466,206 | 9/1969 | Beck | 156—3 |

GIL WEIDENFELD, Primary Examiner

U.S. Cl. X.R.

156—3